United States Patent
Gooi et al.

(10) Patent No.: US 11,552,416 B2
(45) Date of Patent: Jan. 10, 2023

(54) RUGGED MEMORY MODULE RETAINER CLIP SYSTEM

(71) Applicant: SMART Modular Technologies Sdn. Bhd., Pulau Pinang (MY)

(72) Inventors: Kwang Jin Gooi, Pulau Pinang (MY); Muhammad Annuar Bin Johani, Kedah (MY); Ali Akbar Bin Abdul Aziz, Pulau Pinang (MY)

(73) Assignee: SMART MODULAR TECHNOLOGIES SDN. BHD., Pulau Pinang (MY)

( * ) Notice: Subject to any disclaimer, the term of this patent is extended or adjusted under 35 U.S.C. 154(b) by 353 days.

(21) Appl. No.: 16/790,663

(22) Filed: Feb. 13, 2020

(65) Prior Publication Data

US 2021/0203090 A1    Jul. 1, 2021

(30) Foreign Application Priority Data

Dec. 27, 2019  (MY) .............................. PI2019007836

(51) Int. Cl.
*H01R 12/70* (2011.01)
*H01R 43/26* (2006.01)
*F16B 2/22* (2006.01)

(52) U.S. Cl.
CPC ........... *H01R 12/7029* (2013.01); *F16B 2/22* (2013.01); *H01R 12/7023* (2013.01); *H01R 43/26* (2013.01)

(58) Field of Classification Search
CPC .............. H01R 13/633; H01R 13/6335; H01R 12/7029; H01R 12/7023; H01R 43/26; F16B 2/22
USPC .................................................. 439/160, 382
See application file for complete search history.

(56) References Cited

U.S. PATENT DOCUMENTS

| | | | | |
|---|---|---|---|---|
| 7,677,907 B2* | 3/2010 | Guan | ................... | H01R 12/721 439/157 |
| 8,403,689 B2* | 3/2013 | Li | ................... | H01R 12/721 439/160 |
| 8,665,587 B2* | 3/2014 | Peng | ................... | G06F 1/185 361/801 |
| 2005/0130474 A1* | 6/2005 | Tsai | ................... | H05K 7/1405 439/160 |

* cited by examiner

*Primary Examiner* — Gary F Paumen
(74) *Attorney, Agent, or Firm* — Withrow & Terranova, P.L.L.C.

(57) ABSTRACT

A memory module testing system operating in a vibratory environment can retain a memory module in place in a memory socket using both socket latches and a retainer clip. The retainer clip can attach to a module support tower of the memory socket. The retainer clip can have a flexible multi-spring structure forming a three-axis vibration dampening system that can prevent the socket latches from opening while testing in the test environment. The retainer clip can secure the socket latches using an upper flange and a lower flange to prevent unintended motion of the socket latches. The retainer clip can be secured to the module support towers at the ends of the memory socket using clip arms and clip arm tips to attach to the module support towers.

19 Claims, 8 Drawing Sheets

INITIAL CLIP HEIGHT 1106

RUGGED MEMORY MODULE RETAINER CLIP SYSTEM

PRIORITY CLAIM

This application claims benefit under 35 U.S.C. § 119 of Malaysian Application No. PI2019007836, filed Dec. 27, 2019, the entire contents of which is hereby incorporated by reference as if fully set forth herein. The applicant(s) hereby rescind any disclaimer of claim scope in the parent application(s) or the prosecution history thereof and advise the USPTO that the claims in this application may be broader than any claim in the parent application(s).

TECHNICAL FIELD

Embodiments relate generally to memory modules attached to computer systems, and, more specifically, to retainer clips for attaching memory modules to computer systems in ruggedized environments with vibration.

BACKGROUND

The approaches described in this section are approaches that could be pursued, but not necessarily approaches that have been previously conceived or pursued. Therefore, unless otherwise indicated, it should not be assumed that any of the approaches described in this section qualify as prior art merely by virtue of their inclusion in this section.

Modern computing involve certain operations of computer systems that are equipped with main memory units and memory storage sub-systems for processing by one or more processors. The memory units can be used to store data and include high speed interfaces between memory modules and the processor units of the computer systems. The memory units can be modular devices coupled to sockets to allow for replaceability and upgradeability.

As technology has improved, the memory modules have increased in capacity and performance. The memory bus interface between the memory modules and the computing systems have increased in size and speed to match the memory modules. Evaluating and testing the memory modules mounted in the memory sockets is required for verify performance of the memory modules and the computer system. Further, as computer systems are more widely used in industrial and consumer environments, they must be adequately tested under a variety of environmental conditions.

The requirements of modern computer systems and their associated memory testing systems are constantly increasing to accommodate the ever increase needs of modern computing applications. Computing power, local memory speed, storage capacity, data transfer rates, and power requirements grow without limit and require innovative solutions to satisfy the demands of modern computer systems and their deployment environments.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION

In the following description, for the purposes of explanation, numerous specific details are set forth in order to provide a thorough understanding of the present invention. It will be apparent, however, that the present invention may be practiced without these specific details. In other instances, well-known structures and devices are shown in block diagram form in order to avoid unnecessarily obscuring the present invention.

Embodiments are described herein according to the following outline:
   1.0. General Overview
   2.0. Structural Overview
   3.0. Implementation Mechanism—System Overview
      3.1. Memory Module
      3.2. Retainer Clip
   4.0. Functional Overview
   5.0. Example Embodiments
   6.0. Extensions and Alternatives
1.0. General Overview Approaches, techniques, and mechanisms are disclosed for operating a testing system for memory modules. The testing system with the memory-modules can be operated in an industrial environment including vibratory environments will retaining the memory modules in place in the memory sockets.

The testing system can include a computing system than can execute testing programs to check the quality, operation, capacity, and other characteristics of memory modules. The memory modules can be attached to memory sockets that can be embedded in the testing system or deployed on dedicated testing units. The testing system can include environmental testing such as vibration testing or other ruggedized testing types.

According to one embodiment, the memory modules can be attached in place in the memory sockets using a retainer clip to secure the socket latches used to hold the memory modules in place. However, in high vibration situations, the memory modules can become loose or dislodge completely if the socket latches do not hold. The retainer clip provides additional support for the socket latches and prevent the socket latches from coming loose and opening.

According to another embodiment, the retainer clips provide stability and retention along all three axes. The structure of the retainer clips secures the socket latches with an upper and lower flange, while providing a stable base for the retainer clips that are attached to the module support towers at the ends of the memory socket.

In other aspects, the invention encompasses different testing and retention apparatuses and systems configured to carry out the foregoing techniques.

2.0. Structural Overview

Figure 1:
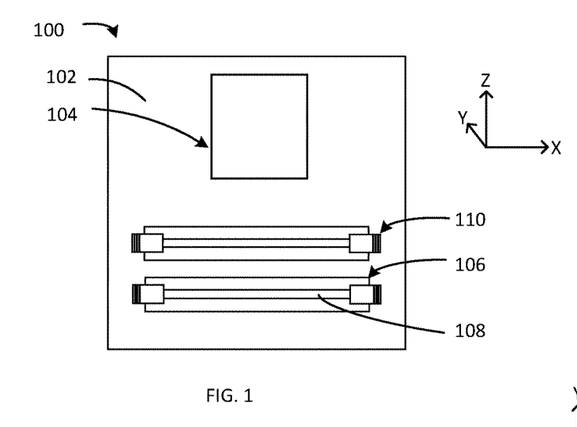
FIG. 1 depicts a view of a computer system having memory module in an embodiment.

FIG. 1 illustrates a computer system 100 having memory module 108 in a memory socket 106 in an embodiment. The computer system 100 can include a processor unit 104 and one or more of the memory sockets 106 attached to a motherboard 102. The memory sockets 106 can have the memory modules 108 secured in place using socket latches 110.

The computer system 100 can represent a consumer, industrial, or test system. For example, the computer system 100 can be a system for testing the memory modules 108. In another example, the computer system 100 can be subject to harsh environmental conditions including vibration, mechanical friction, and other factors.

In an example, the computer system 100 can be a testing system for testing the memory modules 108. The Although the computer system 100 is shown with two of the memory modules 108, it is understood that the computer system 100 can have any number of the memory sockets 106 and the memory modules 108. Further, the memory sockets 106 may be attached directly to the motherboard 102 or may be on a separate test board (not shown) and coupled to the motherboard 102.

The motherboard 102 is a mounting surface for attaching components of the computer system 100. The motherboard 102 can be a printed circuit board, a flexible circuit board, a flat circuit board, or similar mounting surface with conductive traces to convey electronic signals between components. The motherboard 102 can be a flat mounting surface, a curved mounting surface, a daughterboard, a substrate, a carrier, or similar type structure.

The socket latches 110 are moveable mechanical structures for holding the memory modules 108 in place when the socket latches 110 are closed. The socket latches 110 can eject the memory modules 108 when the socket latches 110 are opened.

The computer system 100 can include the motherboard 102 oriented in an x-z plane. The x-axis can be oriented along the length of the memory sockets 106. The z-axis can represent depth and be oriented along the direction between the processor unit 104 and the memory sockets 106. The y-axis can represent the vertical height and be oriented perpendicular to the x-z plane of the motherboard 102. Although the orientations of the various system components are given, it is understood that different physical configurations can be used and the axes can be changed, swapped, or modified as needed. The directions are provided as guidelines to show different embodiments and other possible configurations.

Figure 2:
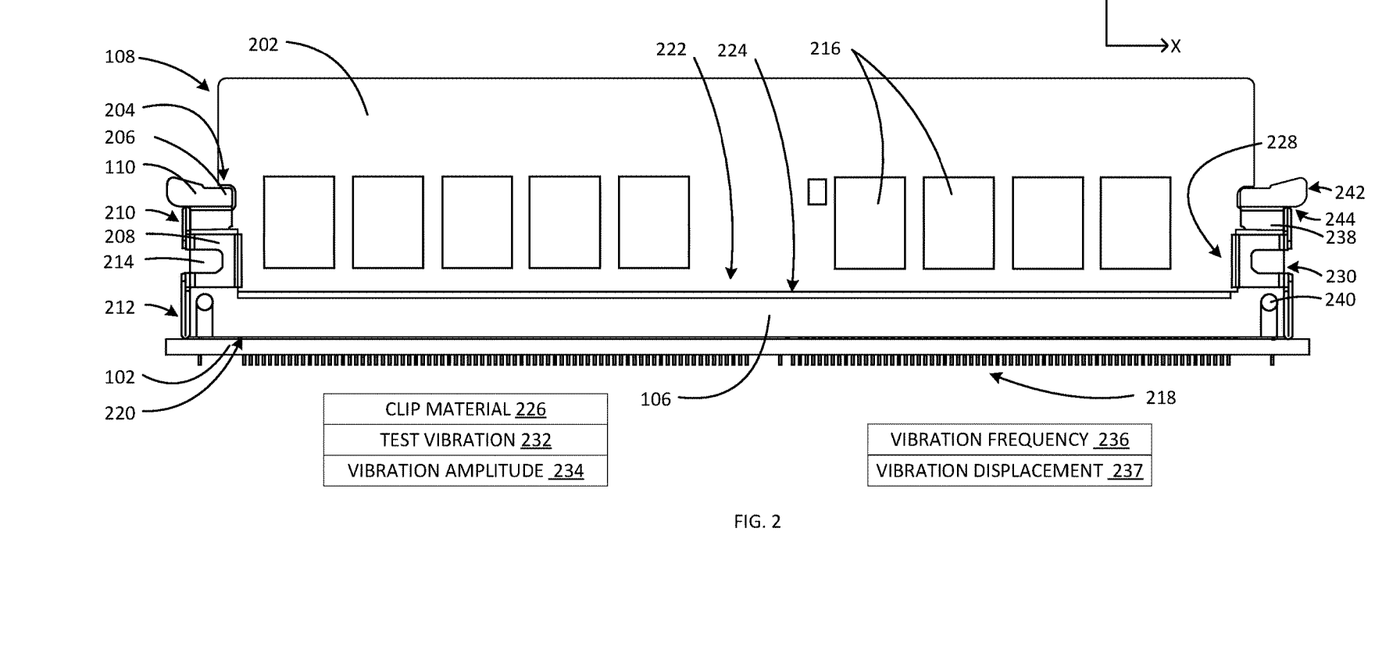
FIG. 2 depicts an example of a memory module attached to the memory socket in a further embodiment.

FIG. 2 illustrates an example of a memory module 108 attached to the memory socket 106 in a further embodiment. The memory module 108 can be attached to the memory socket 106 mounted on the motherboard 102.

The memory socket 106 is a mechanical structure acting as an interface between the motherboard 102 and the memory module 108. The memory socket 106 can have a variety of configuration. For example, the memory socket 106 can be a DDR3 DIMM socket, a DDR4 DIMM socket, a DDR5 DIMM socket, or a socket for a similar memory device type.

The memory socket 106 can be attached to the motherboard 102 using the socket pins 218. The socket pins 218 are electrically conductive elements for providing a conductive path to the socket and to the pins of the memory modules 108.

The memory socket 106 can include the socket body 220 having the module support towers 214 at each end of the socket body 220. The socket latches 110 can be rotationally coupled to the memory socket 106. The socket latches 110 can include a pin, shaft, journal, or other mechanical element. The socket body 220 can be formed from plastics, liquid crystal polymers, polyamide, resin, nylon, or other heat resistant materials with high mechanical strength.

The socket latches 110 are structural elements shaped to provide retention for the memory module 108. The socket latches 110 can be rotational coupled to the memory socket 106. The socket latches 110 can also be used to eject the memory module 108 by opening the socket latches 110.

The socket body 220 can include the socket slot 222 for holding the memory module 108. The socket slot 222 can include socket contacts 224 for electrically connecting with the pins of the memory module 108. The socket contacts 224 are electrical conductors for receiving electrical signals from the memory module 108.

The memory module 108 can include the memory chips 216 mounted on a module circuit board 202 and memory module notches 204 in the module circuit board 202. The memory chips 216 are the integrated circuits that provide the memory storage area for the module. The memory module notch 204

The memory module 108 can be inserted into the socket slot 222 of the memory socket 106 and secured in place using the socket latches 110. The socket latches 110 can include a socket latch tab 206 that is configured to fit into the memory module notch 204 to hold the memory module 108 in place when the socket latches 110 are engaged.

The socket latches 110 can include a latch head 242 and a latch shaft 238. The latch shaft 238 can extend down from the latch head 242 to a latch pivot 240. The latch shaft 238 is a portion of the socket latches 110 that can act as the body of the latch. The latch pivot 240 is a structure for rotationally coupling the socket latches 110 to the memory socket 106. For example, the latch pivot 240 can be a pin or shaft attached to the memory socket 106 with the latch pivot 240 in a hole in the latch shaft 238. The socket latches 110 can rotate around the latch pivot 240.

The latch head 242 is the top portion of the socket latches 110 and can include a serrated top area and the socket latch tab 206. The socket latches 110 can include a latch head bottom side 244 of the socket latches 110. The latch head bottom side 244 can be directly on an upper flange 210 of a retainer clip 208. The upper flange 210 can be directly on an outer side of the latch shaft 238. A portion of the upper flange 210 can be directly on a portion of the socket latches 110 with no intervening elements. A portion of a lower flange 212 can be directly on the motherboard 102.

The memory module notch 204 can have different configurations. For example, the DDR3 DIMM memory module can have two notches to accommodate low profile modules and very low-profile modules. The DDR4 DIMM memory module can have a single notch for both the low-profile modules and the very low-profile modules.

In an illustrative example, the memory module 108 can be inserted into the memory socket 106 with the application of sufficient force. In one case, the memory socket 106 can have an insertion force of approximately 106 Newtons (N). In another case, the memory socket 106 can require an insertion force of more than 106 N.

In some environments, the computer system 100 can experience vibration and other mechanical forces that can potentially jolt the memory module 108 from the memory socket 106. For example, this can include test environments or production environments in factory conditions. In cases like this, the memory module 108 needs to be attached to the memory socket 106 in a more secure manner.

The socket latches 110 can be further secured to the memory socket 106 using a retainer clip 208. The retainer clip 208 is a mechanical component designed to attach around the module support tower 214 and hold the socket latch 110 in place. The retainer clip 208 can help prevent the accidental opening or loosening of the socket latch 110 in high vibration environments, such as testing, shipping, manufacturing, or other similar environmental conditions.

The retainer clip 208 can be formed from a retainer clip material 226. The retainer clip material 226 can be a plastic, metal, alloy, epoxy, thermoplastic polymer, polycarbonate, acrylonitrile butadiene styrene, nylon, aluminum, stainless steel, spring steel, other polymer materials, a 3D-printing stock material, or a combination thereof. The retainer clip 208 can be formed by 3D printing, extrusion, molding, etching, assembling, folding, or other similar manufacturing processes.

The retainer clip 208 can be formed in a variety of ways. For example, the retainer clip 208 can be formed by molding, 3D-printing, cutting, laser forming, stamping, casting, powder sintering, or other similar techniques.

The retainer clip 208 can attach to the module support tower 214 with a spring action based on the physical shape of the retainer clip 208. The retainer clip 208 can clip into place by contacting the module support tower 214 on a tower inner side 228 of the module support tower 214. The retainer clip 208 can include an opening on the inner side of the clip to allow space for the memory module 108. In another embodiment, the retainer clip 208 can also contact the front and back sides of the module support tower 214.

The retainer clip 208 can include the upper flange 210 and the lower flange 212. The upper flange 210 can be sized to be in direct contact with the latch head bottom side of the socket latch 110. The upper flange 210 can support the socket latch 110 and prevent the socket latch 110 from opening.

The lower flange 212 can be sized to be in direct contact with the motherboard 102. The lower flange 212 can provide support for the retainer clip 208 to keep the upper flange 210 in direct contact with the socket latch 110.

When the retainer clip 208 is in place on the module support tower 214, the socket latch 110 is locked into position and cannot be activated or opened. The retainer clip 208 can then keep the socket latch 110 in place and keep the socket latch tab 206 in the memory module notch 204. The locking mechanism of the socket latch tab 206 positioned in the memory module notch 204 can keep the memory module 108 securely in the socket slot 222 of the memory socket 106.

In addition, the retainer clip 208 acts as a vibration dampening system to reduce the effects of vibration on the memory module 108 in the memory socket 106. The retainer clip 208 can act as a three-axis vibration damper by reducing vibration along the X, Y, and Z axes. The retainer clip 208 can reduce vibration by acting like a spring and deforming under vibration or stress. The retainer clip 208 can couple together the memory module 108, the memory socket 106, and the socket latch 110 to reduce the level of relative motion between the components.

In an illustrative example, securing the memory module 108 in the socket slot 222 in an environment with sufficient vibration to dislodge the memory module 108 can support the proper operation of the memory module 108. Minimizing unnecessary and unwanted motion between the memory module 108 and the memory socket 106 can reduce the number of errors or other operational problems with the memory module 108.

In the test environment, a test vibration 232 can be applied to the computer system 100. The test vibration 232 can be an example of the vibratory environment that the system may encounter. The test vibration 232 can be applied in a variety of ways. For example, the test vibration 232 can be applied with a shaking device, a live environment, a constrained vibration device, or a combination thereof.

Vibration is the motion of an oscillating body about a reference position. Vibration can be a complex combination of signals that describe the physical acceleration and motion of an object. Vibration can be characterized by components of displacement, amplitude, and frequency. In some cases, vibration may include irregular, non-periodic motion, displacement, amplitude, and frequency components. The test vibration 232 can have a vibration amplitude 234, a vibration frequency 236, and a vibration displacement 237.

The vibration amplitude 234 is the measurement of the displacement, velocity, or acceleration of the test vibration 232. The vibration amplitude 234 can have units of meters (m), meters per second (m/s), and meters per second squared (m/s^2). The vibration amplitude 234 can also include a directional component if necessary. The vibration amplitude 234 can be expressed in terms of the peak value or root-mean-square value (rms).

The vibration displacement 237 is the distance between the peaks of the oscillation. The vibration frequency 236 is a measurement of how often the test vibration 232 goes though repeated cycles of movement. The vibration frequency 236 is measured in hertz (Hz). The test vibration 232, such as a vibration environment, can have acceleration peaks of up to 109 gravities (g) and pulse durations of approximately 8.0 milliseconds (ms), The test vibration 232 can also be characterized by velocity changes of up to 544 centimeters/second (214 inches per second), and have an equivalent drop height of 151 centimeters (60 inches). Although the test vibration 232 can be used in a test environment, it is understood that the test vibration 232 can include vibration encountered in normal operational usage in the real world.

The memory module 108 mounted in the memory socket 106 can be oriented in an x-y plane. The x-axis can be oriented along the length of the memory sockets 106. The y-axis can represent height and be oriented along the direction extending from the memory socket 106 to the memory module 108.

Figure 3:
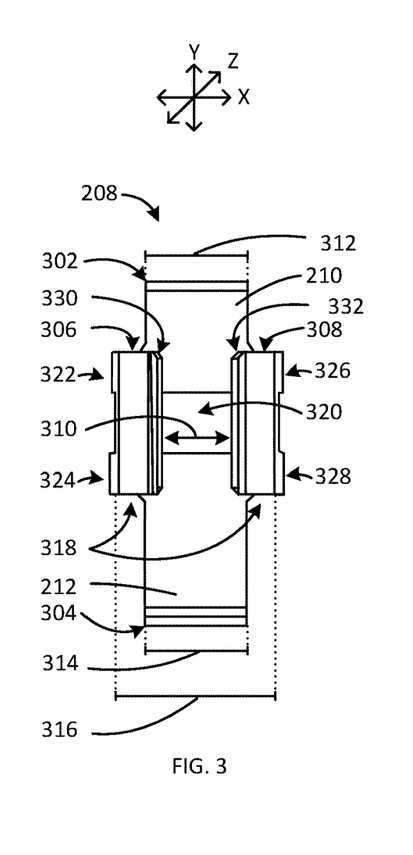
FIG. 3 depicts a front view of a retainer clip.

FIG. 3 illustrates a front view of the retainer clip 208. The retainer clip 208 can be attached to the module support tower 214 to help hold the memory module 108 in place.

The retainer clip 208 includes the upper flange 210 having an upper flange top 302. The upper flange 210 is a portion of the retainer clip 208 extending upward from the center of mass of the retainer clip 208. The upper flange 210 can be a leaf or extension of material forming a structural element for contacting other components. The upper flange 210 can be a flat rectangular plate or member forming part of a vertical flat spring of the retainer clip 208. The upper flange 210 is sized to put the upper flange top 302 in contact with the bottom of the socket latch 110. The upper flange 210 can have an upper flange width 312 measuring the width of the upper flange 210.

The retainer clip 208 can include the lower flange 212 having a lower flange bottom 304. The lower flange 212 is a portion of the retainer clip 208 extending downward from the center of mass of the retainer clip 208. The lower flange 212 can be a leaf or extension of material forming a structural element for contacting other components. The lower flange 212 can be a flat rectangular plate or member forming part of a vertical flat spring of the retainer clip 208. The lower flange 212 is sized to put the lower flange bottom 304 in direct contact with the top of the motherboard 102. The lower flange 212 can have a lower flange width 314 measuring the width of the lower flange 212. The lower flange bottom 304 can be coplanar with the top surface of the motherboard 102. In another example, the lower flange bottom 304 can be coplanar with the bottom surface of the memory socket 106.

The retainer clip 208 can include clip arms 318 including as a left clip arm 306 and a right clip arm 308. The clip arms 318 are attached between the upper flange 210 and the lower flange 212. The left clip arm 306 and the right clip arm 308 can be separated by a clip opening 320 having a clip opening width 310. The clip opening 320 can have a vertical orientation.

The clip arms 318 can be positioning against an inner side of the module support tower 214 to keep the upper flange 210 and the lower flange 212 directly against an outer side of the module support tower 214, thus preventing the flanges from moving horizontally along the x-axis. The clip arms 318 can be positioned under tension and directly against a portion of the sides of the module support tower 214 to prevent the upper flange 210 and the lower flange 212 from moving along the z-axis. Thus, the retainer clip 208 constrains the movement of the socket latch 110 in all X, Y, and Z directions. By restraining the movement of the socket latch 110, the retainer clip 208 can prevent unwanted motion of the memory module 108 under vibration or in a high vibration environment. The retainer clip 208 can be a three-axis spring. The retainer clip 208 can flex in the X, Y, and Z-directions.

The left clip arm 306 includes a left arm tip 330 at the end of the left clip arm 306 on the side opposite the upper flange 210. The left arm tip 330 can be configured to have a curved structure to contact the inner side of the module support tower 214.

The right clip arm 308 includes a right arm tip 332 at the end of the right clip arm 308 on the side opposite the upper flange 210. The right arm tip 332 can be configured to have a curved structure to contact the inner side of the module support tower 214.

The left clip arm 306 and the right clip arm 308 can have a retainer clip inner width 316. The retainer clip 208 can be stretched open to increase the size of the retainer clip inner width 316 by moving the left clip arm 306 and the right clip arm 308 apart.

The left clip arm 306 can include a left upper arm segment 322 and a left lower arm segment 324. The left upper arm segment 322 can be directly connected to the upper flange 210. The left lower arm segment 324 can be directly connected to the lower flange 212.

The right clip arm 308 can include a right upper arm segment 326 and a right lower arm segment 328. The right upper arm segment 326 can be directly connected to the upper flange 210. The right lower arm segment 328 can be directly connected to the lower flange 212.

The left upper arm segment 322 is connected between the upper flange 210 and the left arm tip 330. The right upper arm segment 326 is connected between the upper flange 210 and the right arm tip 332. The left lower arm segment 324 is connected between the lower flange 212 and the left arm tip 330. The right lower arm segment 328 is connected between the lower flange 212 and the right arm tip 332.

The retainer clip 208 forms a vertical flat spring with the upper flange 210 and the lower flange 212 connected by the left clip arm 306 and the right clip arm 308. Under compression, the retainer clip 208 can flex and the upper flange top 302 and the lower flange bottom 304 can press outward. The vertical spring can flex along the y-axis perpendicular to the x-z plane of the motherboard. The y-axis can also be described as running along a line extending from the lower flange 212 to the upper flange 210.

The retainer clip 208 forms a horizontal spring with the left clip arm 306 and the right clip arm 308 connected by the upper flange 210 and the lower flange 212. The spring formed by the two arms can grasp the sides of the module support tower 214 to limit motion along the z-axis. The retainer clip inner width 316 can be configured to be smaller than the width of the module support tower 214. The left clip arm 306 and the right clip arm 308 can be pulled apart until the clip opening 320 is large enough to allow the module support tower 214 to be positioned within the retainer clip 208. Once the module support tower 214 is positioned inside the retainer clip 208, the arms can be released and allowed to revert toward their original size and position. This can apply a clamping force inward onto the module support tower 214 which is wider than the original size of the retainer clip inner width 316. The arms can then spring back and exert a horizontal force to press against the sides of the module support tower 214, thus holding the retainer clip 208 in position horizontally along the z-axis. The z-axis is horizontally perpendicular to the long axis of the memory socket.

The retainer clip 208 forms another horizontal spring element with the left arm tip 330 and the right arm tip 332 that exerts a horizontal force along the x-axis. When the left arm tip 330 and the right arm tip 332 are positioned around and against the inner side of the module support tower 214, the tips are in a flexed or deformed configuration and apply a force against the inner side of the module support tower 214.

The retainer clip 208 can immobilize the socket latch 110 by positioning the upper flange top 302 directly against and in direct contact with the bottom surface of the socket latch 110, thus preventing the socket latch 110 from moving along the y-axis or rotating downward. Immobilize can mean that the upper flange top 302 can prevent the socket latch 110 from moving enough to allow the memory module 108 to get loose or become detached from the memory socket 106.

Figure 4:
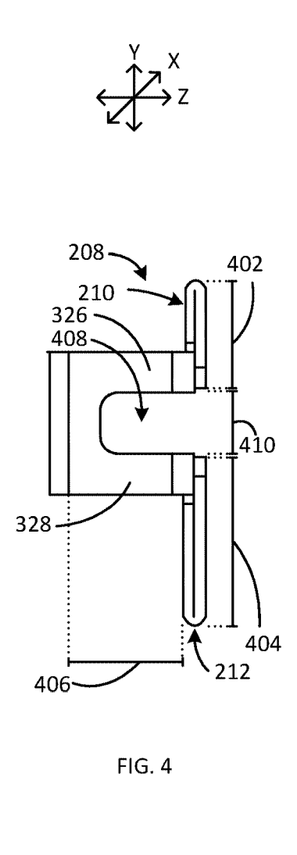
FIG. 4 depicts a side view of a retainer clip.

FIG. 4 illustrates a side view of the retainer clip 208. The retainer clip 208 can be attached to the module support tower 214 to help hold the memory module 108 in place. The side views of the retainer clip 208 are the sides facing perpendicularly away from the clip arms 318.

The upper flange 210 of the retainer clip 208 can have an upper flange length 402. The lower flange 212 of the retainer clip 208 can have a lower flange length 404.

The retainer clip 208 can have a clip inner depth 406 measured from the inner side of the upper flange 210 or the lower flange 212 to the inner side of the clip arms 318. The clip inner depth 406 can be sized to match the side of the module support tower 214.

The retainer clip 208 can include a clip gap 408 having a clip gap height 410. The clip gap 408 is the vertical opening on each of the clip arms 318. The clip gap 408 can provide a vertical compression spring effect that can help align and position the upper flange 210 and the lower flange 212.

The clip gap 408 in the clip arms 318 can form a compression spring in the retainer clip 208. The compression spring keeps components from coming together.

The retainer clip 208 experiences a compression force from the socket latch 110 and the motherboard 102. A compression force squeezes materials together or shortens them. A tension force pulls materials apart or elongates them. A compression spring is designed to keep components from coming together. A tension spring is designed to pull components together.

The clip gap height 410 is the distance across the opening formed by the clip gap 408. The clip gap height 410 can influence the amount of springiness provide by the retainer clip 208.

In an example, the upper flange 210 and the lower flange 212 can be formed by extending the flange material and then folding the material back onto itself. This can result in a stronger and more flexible structure for the upper flange 210 and the lower flange 212. The folding process can also be used to more precisely size the upper flange 210 and the lower flange 212.

Figure 5:
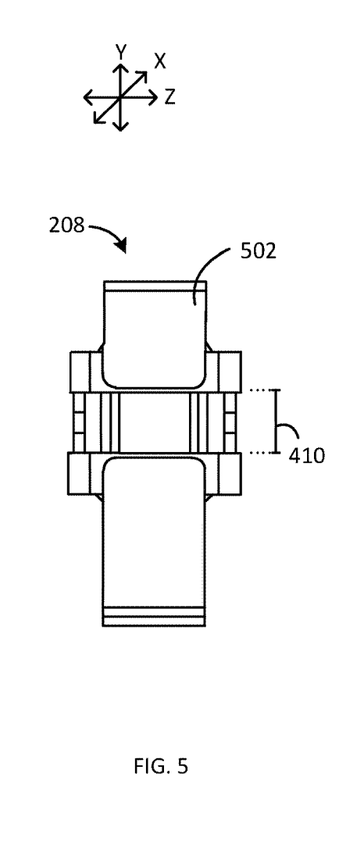
FIG. 5 depicts a back view of a retainer clip.

FIG. 5 illustrates a back view of the retainer clip 208. The retainer clip 208 can be attached to the module support tower 214 to help hold the memory module 108 in place. The back side of the retainer clip 208 is the side facing away from the clip opening 320.

The retainer clip 208 can include a clip back 502 formed by the back of the clip arms 318. The clip arms 318 can have a vertical separation as indicated by the clip gap height 410.

Figure 6:
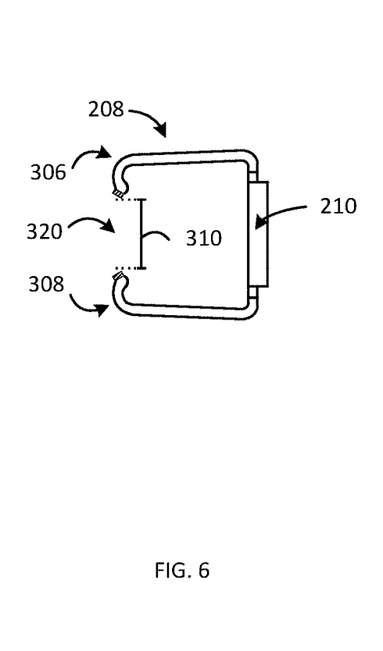
FIG. 6 depicts a top view of a retainer clip.

FIG. 6 illustrates a top view of the retainer clip 208. The retainer clip 208 can be attached to the module support tower 214 to help hold the memory module 108 in place.

The retainer clip 208 can include the left clip arm 306 and the right clip arm 308. The two arms are separated by the clip opening width 310 of the clip opening 320. The two arms are connected by the upper flange 210 and the lower flange 212.

The clip opening width 310 can change when the retainer clip 208 is in use. When the retainer clip 208 is attached to the module support tower 214, the retainer clip 208 can be stretched open and then allowed to close in place. The clip opening width 310 can be larger when the retainer clip 208 is held open by the module support tower 214.

Figure 7:
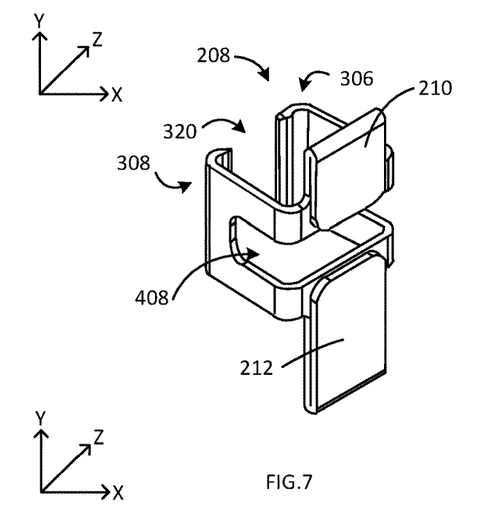
FIG. 7 depicts a first isometric view of a retainer clip.

FIG. 7 illustrates a first isometric view of the retainer clip 208. The retainer clip 208 can be attached to the module support tower 214 to help hold the memory module 108 in place.

The retainer clip 208 can include the left clip arm 306 and the right clip arm 308. The separation between the arms can form the clip opening 320.

As shown in the figure, the left clip arm 306 and the right clip arm 308 for a mechanical spring structure to hold the module support tower 214. The module support tower 214 can be positioned between the left clip arm 306 and the right clip arm 308. The retainer clip 208 can include the upper flange 210 and the retain lower flange 212. The separation between the two flanges can form the clip gap 408. The back surface of the upper flange 210 is coplanar with back surface of the lower flange 212.

Figure 8:
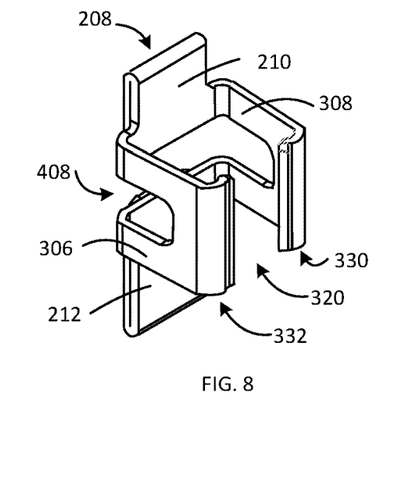
FIG. 8 depicts a second isometric view of a retainer clip.

FIG. 8 illustrates a second isometric view of the retainer clip 208. The retainer clip 208 can be attached to the module support tower 214 to help hold the memory module 108 in place.

The retainer clip 208 can include the left clip arm 306 and the right clip arm 308. The separation between the arms can form the clip opening 320.

The left arm tip 330 and the right arm tip 332 can be in direct contact with the inner side of the module support tower 214. The two arm tips can help hold the retainer clip 208 in place.

As shown in the figure, the left clip arm 306 and the right clip arm 308 include the left arm tip 330 and the right arm tip 332. The left arm tip 330 and the right arm tip 332 can be in direct contact with the inner side of the module support tower 214. The two arm tips can help hold the retainer clip 208 in place.

The retainer clip 208 can include the upper flange 210 and the retainer lower flange 212. The separation between the two flanges can form the clip gap 408.

3.0. Implementation Mechanism—System Overview 3.1. Memory Module

Figure 9:
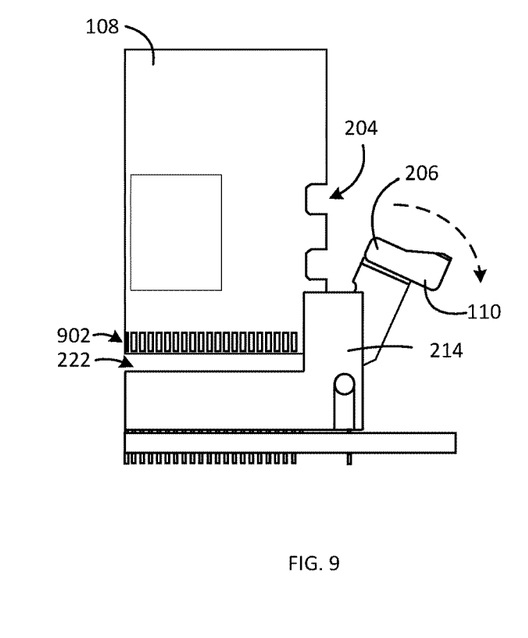
FIG. 9 depicts an example of a memory module in a pre-insertion configuration.

FIG. 9 illustrates an example of the memory module 108 in a pre-insertion configuration. The memory module 108 can be inserted into the memory socket 106 when the socket latches 110 are open.

The memory socket 106 can be prepared for the insertion of the memory module 108 by opening the socket latches 110. The socket latches 110 can be opened by rotating the socket latches 110 outward and downward and exposing the socket slot 222.

The socket latches 110 can be coupled to the memory socket 106 and can pivot rotationally around the mounting joint. The socket latches 110 are configured to engage the socket latch tab 206 with the memory module notch 204 when the socket latches 110 rotate into the closed position. When in the closed position, the socket latches are partially within the module support tower 214.

The memory module 108 can be positioned over the socket slot 222 with the module circuit board 202 aligned in a slot of the module support tower 214. The memory module 108 can have memory module pins 902 on the side toward the memory socket 106. The memory module pins 902 are electrical conductors used to transfer electrical signals from the memory module 108 and the motherboard 102 via the memory socket 106.

Figure 10:
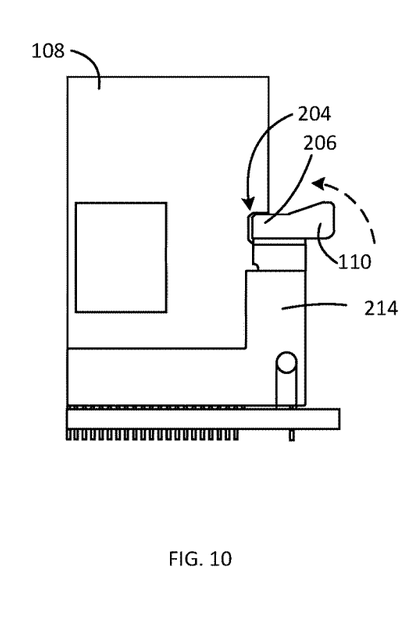
FIG. 10 depicts an example of a memory module mounted in a memory socket in a module inserted configuration.

FIG. 10 illustrates an example of the memory module 108 mounted in the memory socket 106 in a module inserted configuration. The memory module 108 can be inserted into the memory socket 106 and secured in place by closing the socket latches 110 of the module support tower 214.

The memory module 108, such as a DDR4 DIMM memory module, can be inserted into the socket slot 222 by pushing down on the memory module 108 until the memory module pins 902 are in full contact with the socket contacts 224. The socket contacts 224 can exert pressure on the memory module pins 902 to help hold the memory module 108 in place relative to the memory socket 106.

As the memory module 108 is pushed down, the edges of the memory module 108 engage with the socket latches 110 and close the socket latches 110. The socket latch tab 206 can be forced into the memory module notch 204 to retain the memory module 108 in the memory socket 106.

3.2. Retainer Clip

Figure 11:
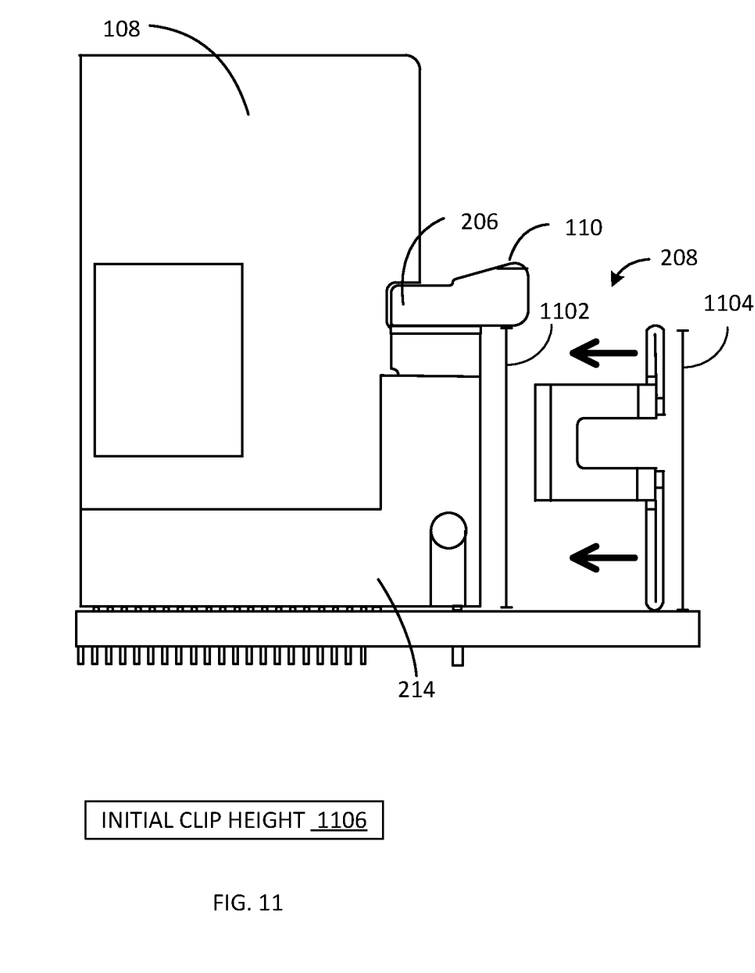
FIG. 11 depicts an example of a memory module and a retainer clip in a pre-attachment configuration.

FIG. 11 illustrates an example of the memory module 108 and the retainer clip 208 in a pre-attachment configuration. The retainer clip 208 is shown in a preliminary stage of operation.

Once the memory module 108 has been inserted into the socket slot 222 of the memory socket 106, the socket latches 110 can be closed to secure the socket latch tab 206 in the memory module notch 204.

With the memory module 108 fully inserted into the socket slot 222, the memory module pins 902 are in electrical contact with the socket contacts 224. The socket contacts 224 exert pressure against the memory module pins 902 to help hold the memory module 108 in place.

In the pre-attachment configuration, the retainer clip 208 can be positioned adjacent to the module support tower 214 of the memory socket 106 with the lower flange bottom 304 directly on the top of the motherboard 102. The clip opening 320 can be on the side closest to the module support tower 214.

The socket latch 110 can have a latch lock height 1102 that is the distance extending from the top surface of the motherboard 102 to the bottom surface of the socket latch 110. The retainer clip 208 can have a retainer clip height 1104 that is the distance extending the upper flange top 302 to the lower flange bottom 304 when the retainer clip 208. The retainer clip height 1104 can have an initial height 1106 measured when the retainer clip 208 is not under tension. The retainer clip height 1104 is sized to be larger than the latch lock height 1102.

The retainer clip height 1104 can vary when a force is applied to either of the flanges. The retainer clip 208. For example, when downward pressure is applied to the upper flange 210, the retainer clip height 1104 can be reduced. But when the pressure is released, the retainer clip 208 can return to the initial height 1106.

To ensure a proper fit, the retainer clip 208 can be vertically squeezed by pressing down on the upper flange 210 before placing the retainer clip 208 around the module support tower 214. This will put the retainer clip 208 under tension and result in a vertical force from the upper flange 210 against the socket latch 110.

The retainer clip 208 can flex at the clip gap 408 to allow for changes in the retainer clip height 1104. The retainer clip 208 can act like a cantilever spring structure with the two flanges joined by the two arms.

The configuration of the retainer clip 208 can provide a vertical flexure between the upper flange 210 and the lower flange 212. The configuration of the retainer clip can also provide a horizontal flexure between the left clip arm 306 and the right clip arm 308.

The retainer clip 208 can be configured to make the width of the module support tower 214 larger than the retainer clip inner width 316 between the left arm tip 330 and the right arm tip 332. Thus, the left arm tip 330 and the right arm tip 332 can apply pressure against the sides of the module support tower 214 to help keep the retainer clip 208 in place.

However, it is understood that in an environment experiencing vibration, such as a manufacturing, test, industrial, consumer use, or other similar environment, the vibration can result in the memory module 108 detaching or coming loose from the memory socket 106. The potential vibration can exert mechanical forces along all three axes, and this can cause the socket latch 110 to loosen and open. Further, the y-axis forces caused by vibration can cause the memory module 108 to move vertically and separate from the memory socket 106.

In another example, the vibration and motion resulting from the test or live environments can cause the memory module pins 902 to be in intermittent or improper contact with the socket contacts 224. This can lead to device errors, short circuits, missing signals, weak signal transmission, increased contact resistance, and other errors. Further, the relative motion of the memory module 108 along the x-axis, the y-axis, and the z-axis can cause mechanical wear on the memory module 108 and the memory module pins 902. Such abrasion can wear away portion of the metal on the memory module pins 902 and damage the memory module 108.

In yet another example, the low-level contact resistance between the memory module pins 902 and the socket contacts 224 can be approximately 10-40 milliohms or less when properly connected. An improper memory module connection to the memory socket 106 can be detected when the low-level contact resistance is above this or other pre-defined resistance values.

Because the memory module 108 and the memory socket 106 are precision components, the vibration can cause deformation or damage to the memory module 108. Such damage or deformation cause lower the reliability of the memory module 108 and introduce additional errors or failures during later operations. Preventing the damage to the memory module 108 by securing the socket latches 110 in place can increase the manufacturing yield and improve operational lifetime of the memory module 108.

Figure 12:
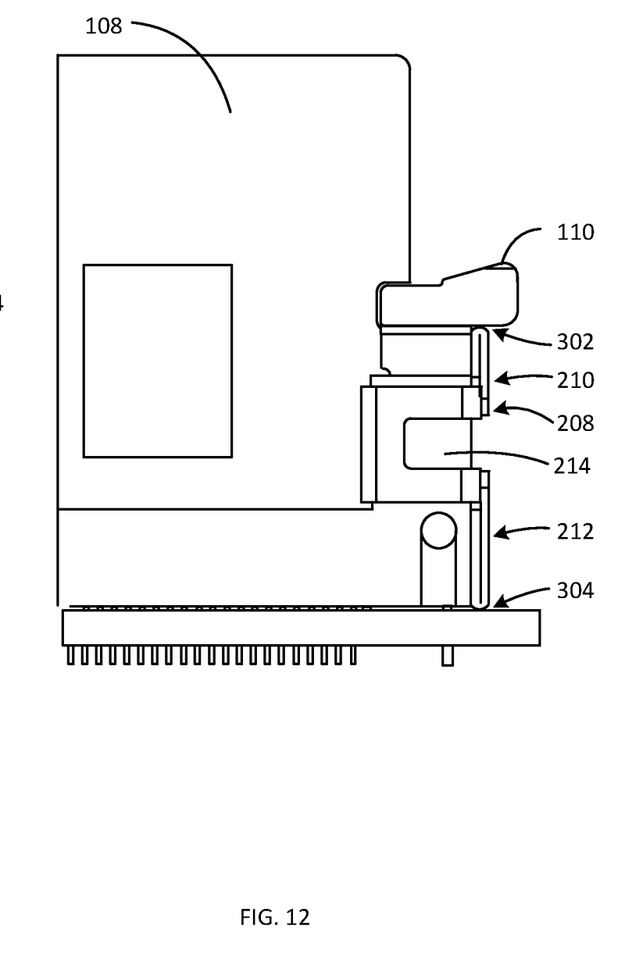
FIG. 12 depicts an example of a retainer clip in a post-attachment configuration.

FIG. 12 illustrates and example of the retainer clip 208 in a post-attachment configuration. The retainer clip 208 is shown in place around the module support tower 214 and holding the socket latch 110 in the closed position. The upper flange 210 is pressing up against the socket latch 110. The lower flange 212 is pressing against the top surface of the motherboard 102.

The retainer clip 208 can be positioned with the left clip arm 306 and the right clip arm 308 around the module support tower 214 and the left arm tip 330 and the right arm tip 332 positioned against the inner side of the module support tower 214.

The retainer clip 208 can be attached to the memory socket 106 expanding the clip opening 320 until it is wide enough to pass around the module support tower 214. The retainer clip 208 can then be placed within the two arms. The arms can then be released and the spring action of the retainer clip 208 can cause the two arms to move together and close on the module support tower 214.

The lower flange bottom 304 can be positioned against the top surface of the motherboard 102. The upper flange 210 can then be depressed until the upper flange 210 can fit beneath the socket latch 110 in the closed position. The retainer clip 208 can then push the upper flange 210 up against the socket latch 110 by using the spring effect provided by the clip gap 408. The opening of the clip gap 408 is facing away from the module support tower 214.

In an alternate configuration, the lower flange 212 can be placed against the joint formed by the memory socket 106 and the motherboard 102 to hold it in place before the pressure is applied to the upper flange 210. This lever action can make it easier to align and attach the retainer clip 208.

In another alternate embodiment, the retainer clip 208 can be affixed to the bottom portion of the memory socket 106 in a semi-permanent or permanent configuration. This could allow the retainer clip 208 to be coupled to the socket and quickly swung into place.

Once the retainer clip 208 is properly placed around the module support tower 214, it will be kept in position along the x-axis, the y-axis, and the z-axis by different portions of different elements. The socket latch 110 can be prevented from moving along the y-axis by the upper flange top 302 in direct contact with the latch head bottom side 244 of the socket latch 110. The retainer clip 208 can be prevented from moving along the x-axis by a combination of the left arm tip 330, the right arm tip 332, an inner side of the upper flange 210, and an inner side of the lower flange 212. The retainer clip 208 can be prevented from moving along the z-axis by an inner side of the left clip arm 306 and an inner side of the right clip arm 308. Portions of both inner sides can be directly against corners of the module support tower 214.

Figure 13:
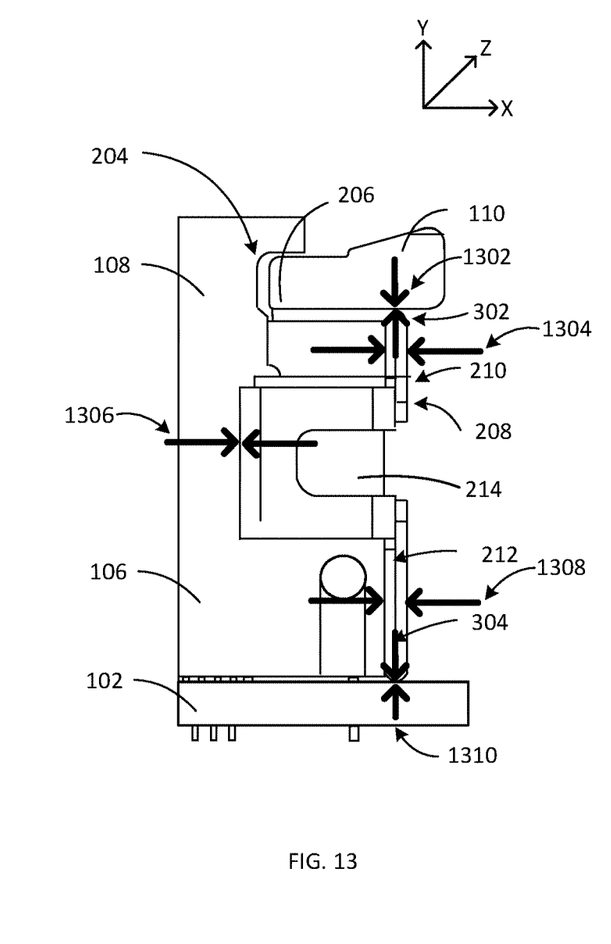
FIG. 13 depicts an example of a side view of a socket latch and a retainer clip.

FIG. 13 illustrates an example of a side view of the socket latch 110 and the retainer clip 208. The retainer clip 208 is attached to the module support tower 214 and supports the socket latch 110. The socket latch tab 206 is secured in the memory module notch 204.

The retainer clip 208 provides support in all three axes to prevent the memory module 108 from unwanted motion relative to the memory socket 106. This is done by keeping the socket latch 110 from opening by constraining the motion of the socket latch 110 and the module support tower 214. The retainer clip 208 and the socket latches 110 are fully constrained in the X, Y, and Z direction.

The retainer clip 208 is kept in place relative to the module support tower 214 and the socket latch 110 by the forces exerted by the retainer clip 208 and the equivalent force pushing back from the module support tower 214. There are several areas where the balanced forces act to keep the system stable along each of the different axis. Balanced forces are equal and opposite in direction and result in a static system.

The first paired forces 1302 can be between the bottom surface of the socket latch 110 and the upper flange top 302. The first paired forces 1302 can help keep the socket latch 110 from moving vertically along the y-axis.

The second paired forces 1304 can be between a side of the socket latch 110 and a side of the upper flange 210. The second paired forces 1304 can prevent the retainer clip 208 from moving along the x-axis.

The third paired forces 1306 can be between the clip tips and the inner side of the module support tower 214. The left arm tip 330 and the right arm tip 332 can help keep the retainer clip 208 against the body of the module support tower 214.

The fourth paired forces 1308 can be between an outer side of the memory socket 106 and a side of the lower flange 212. The fourth paired forces 1308 can prevent the bottom side of the retainer clip 208 from moving along the x-axis.

The fifth paired forces 1310 can be between the lower flange bottom 304 and the top surface of the motherboard 102. The fifth paired forces 1310 can help keep the retainer clip 208 and the socket latch 110 from moving vertically along the y-axis.

Thus, the retainer clip 208 can support the socket latch 110 along the y-axis using the upper flange 210, the left clip arm 306, the right clip arm 308, and the lower flange 212. The retainer clip 208 acts as a spring providing an upward force from the upper flange top 302 against the bottom surface of the socket latch 110. At the same time, the lower flange bottom 304 provides a downward force against the top surface of the motherboard 102.

Figure 14:
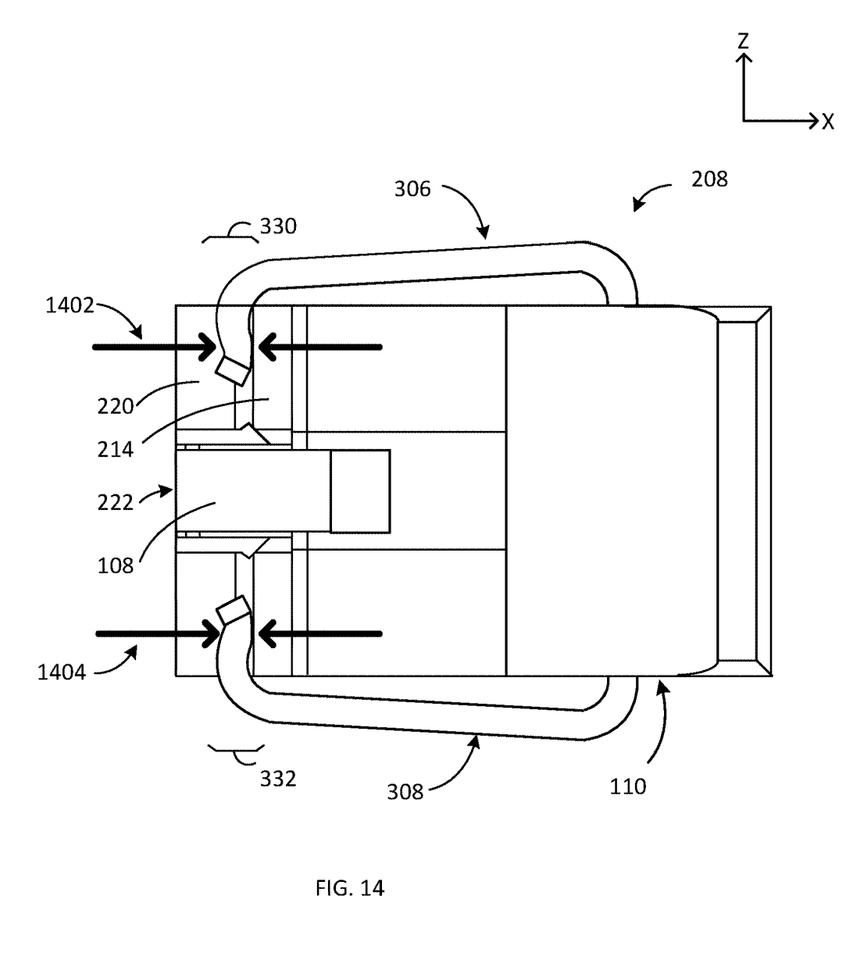
FIG. 14 depicts an example of a top view of the socket latch and a retainer clip.

FIG. 14 illustrates an example of a top view of the socket latch 110 and the retainer clip 208. The retainer clip 208 is attached to the module support tower 214 and supporting the socket latch 110. The socket body 220 can have the socket slot 222.

The retainer clip 208 provides support to prevent the memory module 108 from unwanted motion relative to the memory socket 106. This is done by keeping the socket latch 110 from opening by constraining the motion of the socket latch 110 and the module support tower 214.

Balanced forces are maintained to keep the retainer clip 208 in place relative to the module support tower 214 and the socket latch 110. There five areas where the balanced forces act to keep the system stable.

The sixth paired forces 1402 can be between an inner surface of the module support tower 214 and the left arm tip 330 of the left clip arm 306 of the retainer clip 208. The sixth paired forces 1402 can help keep the retainer clip 208 from moving along the x-axis.

The seventh paired forces 1404 be between an inner surface of the module support tower 214 and the right arm tip 332 of the right clip arm 308 of the retainer clip 208. The seventh paired forces 1404 can help keep the retainer clip 208 from moving along the x-axis.

Figure 15:
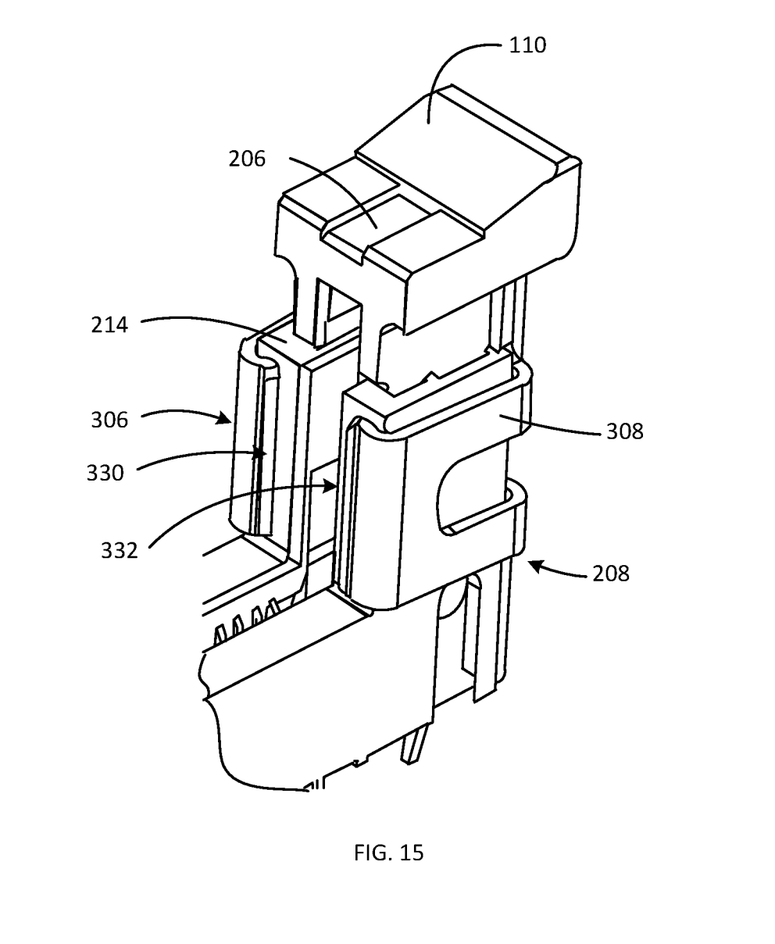
FIG. 15 depicts an example of an isometric view of the socket latch and a retainer clip.

FIG. 15 illustrates an example of an isometric view of the socket latch 110 and the retainer clip 208. The socket latch 110 can include the socket latch tab 206. The retainer clip 208 is attached to the module support tower 214.

The left clip arm 306 extends around the side of the module support tower 214 and positions the left arm tip 330 against an inner surface of the module support tower 214. The right clip arm 308 extends around the side of the module support tower 214 and positions the right arm tip 332 directly against another inner surface of the module support tower 214.

Figure 16:
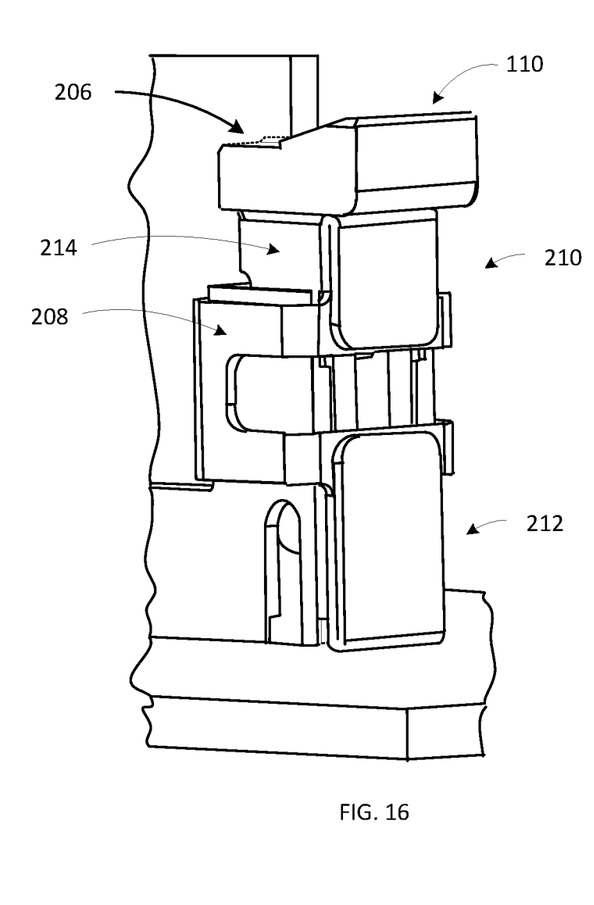
FIG. 16 depicts an example of an isometric view of the retainer clip and a module support tower.

FIG. 16 illustrates an example of an isometric view of the retainer clip 208 and the module support tower 214. The retainer clip 208 is attached to the module support tower 214 and supporting the socket latch 110.

The socket latch 110 is in the closed position and the socket latch tab 206 is secured in the memory module notch 204. The upper flange 210 and the lower flange 212 operate together the prevent the socket latch 110 from moving vertically, thus securing it in place.

Figure 17:
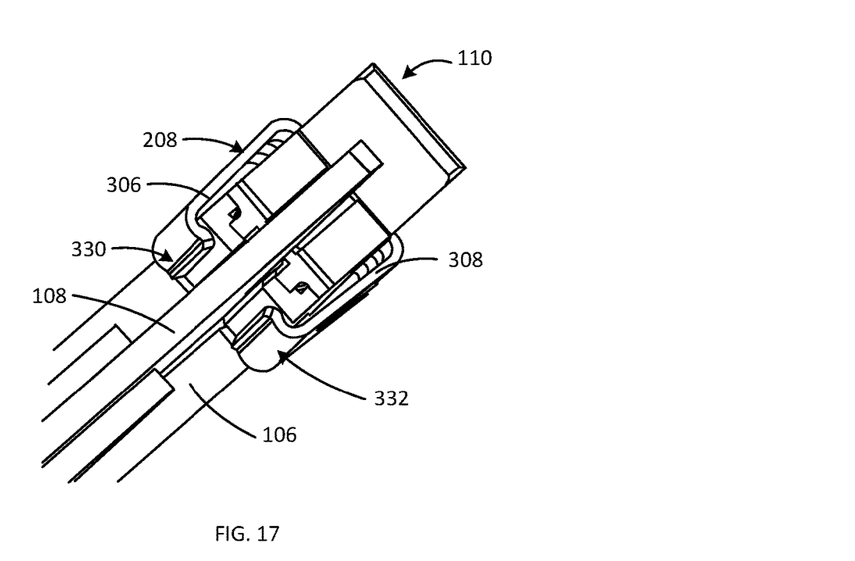
FIG. 17 depicts an example of an isometric view of a socket latch and a retainer clip.

FIG. 17 illustrates an example of a top isometric view of the socket latch 110 and the retainer clip 208. The retainer clip 208 is attached to the module support tower 214 with the memory module 108 secured in the socket slot 222.

The left clip arm 306 extends around the side of the module support tower 214 and positions the left arm tip 330 against an inner surface of the module support tower 214. The right clip arm 308 extends around the side of the module support tower 214 and positions the right arm tip 332 directly against another inner surface of the module support tower 214. The memory module 108 is in the socket slot 222 and secured by the socket latch 110. The memory module 108 is between the two clip arms 318.

Figure 18:
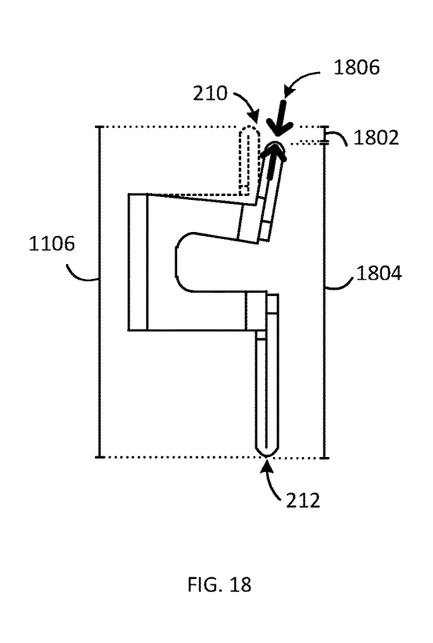
FIG. 18 depicts an example of a side view of a retainer clip.

FIG. 18 illustrates an example of a side view of the retainer clip 208. The retainer clip 208 can be deformed under pressure while being inserted under the socket latch 110.

The retainer clip 208 can be deformed by applying pressure on the upper flange 210 when the lower flange 212 is secured against the motherboard 102. An insertion paired forces 1806 shows the application of a downward insertion force and an upward elastic force in response. This can be the result when the upper flange 210 is pressed downward when inserting the retainer clip 208 under the socket latch 110.

The retainer clip 208 can having an initial height 1106 as measured from the upper flange top 302 to the lower flange bottom 304 when the retainer clip 208 is not under pressure. When the downward pressure is applied, the retainer clip 208 can be deformed by a deformation distance 1802 resulting in a deformed clip height 1804. The deformation distance 1802 is the distance the upper flange 210 moved down under pressure. The deformed clip height 1804 is the distance between the upper flange top 302 and the lower flange bottom 304 when the vertical pressure is applied. The amount of the deformation distance 1802 can be determine by the amount of downward pressure applied. The clip gap 408 in both the left clip arm 306 and the right clip arm 308 for a spring structure that allows the two arms of the retainer clip 208 to be deformed and return to the original shape and size. The clip gap height 410 can also be reduced by the deformation distance 1802.

The shape of the clip gap 408 and the two clip arms provides the retainer clip 208 with a degree of elastic behavior to help keep the retainer clip 208 against the socket latch 110. The amount of force provided by the retainer clip 208 under tension can be determined based on the retainer clip material 226.

Figure 19:
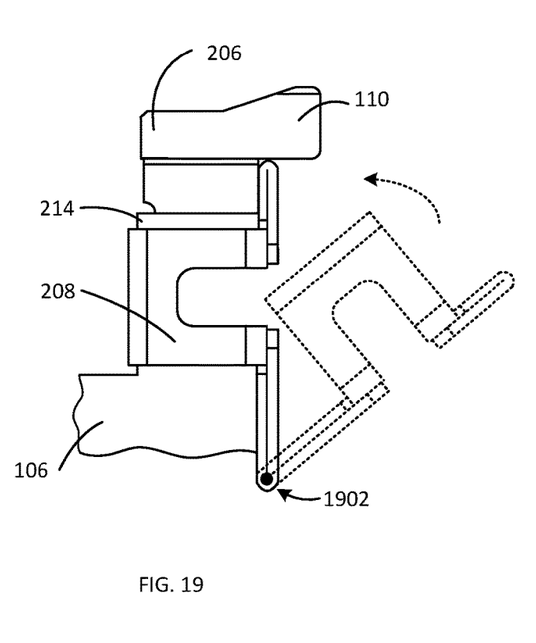
FIG. 19 depicts an example of a side view of a retainer clip attached with a pivot point.

FIG. 19 illustrates an example of a side view of the retainer clip 208 attached with a pivot point 1902. The retainer clip 208 can be deformed under pressure while being inserted under the socket latch 110.

In an illustrative example, the retainer clip 208 can be attached to the memory socket 106 at the pivot point 1902. The pivot point 1902 can be a shaft or pin that is rotationally coupled to the retainer clip 208 at the memory socket 106. Alternatively, the pivot point 1902 can be attached to the motherboard 102. Using the pivot point 1902 can require offsetting the lower flange 212 from the motherboard 102 to accommodate the structural elements of the pivot point 1902. The lower flange 212 of the retainer clip 208 can be secured against the motherboard 102 or against the pin or shaft of the pivot point 1902.

When the retainer clip 208 is attached to the pivot point 1902, the retainer clip 208 can be rotated around the pivot point 1902 to secure the upper flange 210 in position under the socket latch 110. Attaching the retainer clip 208 to the pivot point 1902 can simplify operation by keeping the retainer clip 208 near the memory socket 106.

When the retainer clip 208 is in place under the socket latch 110, the upper flange 210 of the retainer clip 208 can exert upward pressure against the socket latch 110 based on the tension of the retainer clip 208. In this case, the clip gap height 410 is reduced because of the tension in the clip.

Figure 20:
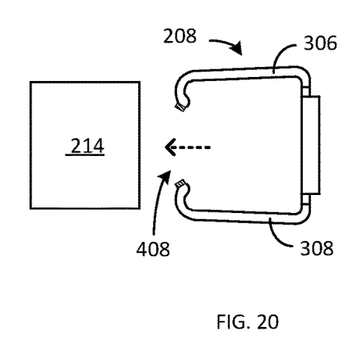
FIG. 20 depicts an example of a top view of the retainer clip being attached to the module support tower.

FIG. 20 illustrates an example of a top view of the retainer clip 208 before attachment to the module support tower 214. The retainer clip 208 can be adjacent to the module support tower 214 with the clip gap 408 nearest to the module support tower 214. The retainer clip 208 can then be moved toward the module support tower 214.

Figure 21:
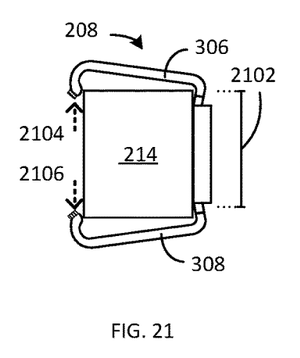
FIG. 21 depicts an example of a top view of the retainer clip before attachment to the module support tower.

FIG. 21 illustrates an example of a top view of the retainer clip 208 being attached to the module support tower 214. The retainer clip 208 can be deformed under pressure while being inserted under the socket latch 110. The left clip arm 306 and the right clip arm 308 can be in their default positions.

The left clip arm 306 and the right clip arm 308 can be opened to increase the size of the clip opening width 310 to a tower access width 2102. The tower access width 2102 is the distance wide enough for the retainer clip 208 to fit around the module support tower 214.

The clip opening 320 can be expanded by applying the left expansion force 2104 to the left clip arm 306 and the right expansion force 2106 to the right clip arm 308. The forces can be applied in a variety of ways, such as by pressing the retainer clip 208 into the module support tower 214, pulling the arms open, pushing the arms open, or a combination thereof. In some embodiments, the arms can be attached to mechanical linkages that can move and open the arms.

Figure 22:
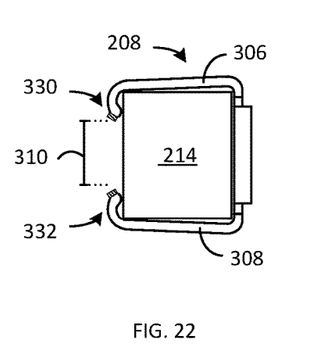
FIG. 22 depicts an example of a top view of the retainer clip attached to the module support tower.

FIG. 22 illustrates an example of a top view of the retainer clip 208 attached to the module support tower 214. The retainer clip 208 can be deformed under pressure while being inserted under the socket latch 110.

After the retainer clip 208 has been attached to the module support tower 214, the left clip arm 306 and the right clip arm 308 are positioned along the side of the module support tower 214 and the left arm tip 330 and the right arm tip 332 are in direct contact with the inner side of the module support tower 214. The arms hold the retainer clip 208 in place. Portion of the left clip arm 306 and the right clip arm 308 are directly against the module support tower 214.

4.0. Functional Overview

Figure 23:
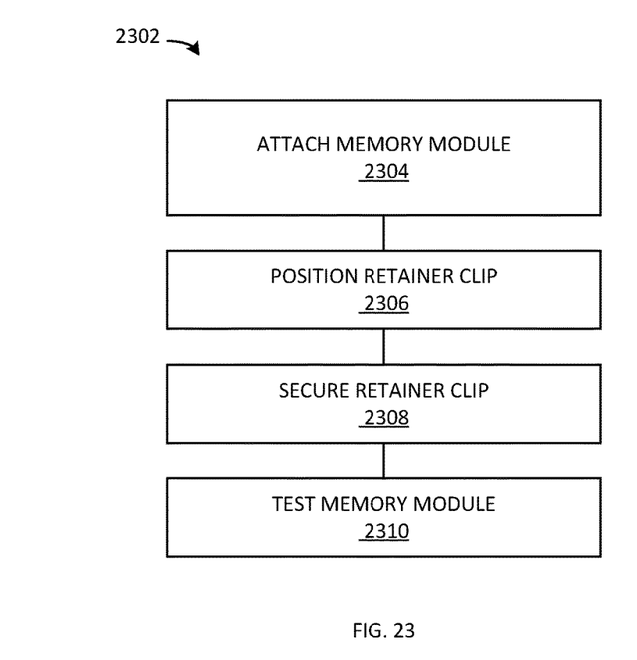
FIG. 23 depicts an example of an operation process flow.

FIG. 23 illustrates an example of an operating process flow 2302. The operating process flow 2302 shows the process for installing the memory modules 108 in the memory socket 106, securing the memory module 108 with the socket latch 110, and securing the socket latch 110 with the retainer clip 208.

The operating process flow 2302 can be implemented in a variety of ways. For example, the operating process flow 2302 can include four steps: an attach memory module step 2304, a position retainer clip step 2306, a secure retainer clip step 2308, and a test memory module step 2310.

In the attach memory module step 2304, the memory module 108 can be positioned above the socket slot 222 with the socket latches 110 in the open position. The memory module 108 can be pushed downward into the socket slot 222 to couple the memory module pins 902 with the socket contacts 224. The socket latches 110 can be moved into the closed position with the socket latch tab 206 in the memory module notch 204.

In the position retainer clip step 2306, the retainer clip 208 can be positioned with the lower flange 212 against the top surface of the motherboard 102. In an alternate configuration, the lower flange 212 can be positioned against the interface between the motherboard 102 and the memory socket 106.

In yet another configuration, the lower flange 212 can be attached to the bottom position of the memory socket 106. The lower flange 212 can be attached to the memory socket 106 and rotationally coupled to a pin or shaft (not shown). This can allow the lower flange 212 to rotate freely around the pin or shaft.

In the secure retainer clip step 2308, the retainer clip 208 can be secured around the module support tower 214 with the upper flange 210 supporting the socket latch 110. The upper flange top 302 can be in direct contact with the bottom surface of the socket latch 110. The upper flange top 302 can be pressing upward against the socket latch 110.

The retainer clip 208 can be positioned around the module support tower 214 of the memory socket 106 in a variety of ways. For example, the retainer clip 208 can be positioned using a robotic manipulator to place the retainer clip 208 against the module support tower 214 and then pressure can be applied to push the clip into place.

The retainer clip 208 can be attached to the bottom of the memory socket 106 and force can be applied to the upper flange 210 to rotate the retainer clip 208 into position. The retainer clip 208 can be attached manually, automatically, using a hydraulic actuator, an electric actuator, an electromechanical actuator, or other similar technique.

If the lower flange 212 of the retainer clip 208 is attached to the memory socket 106, then the retainer clip 208 can be secured to the module support tower 214 by rotating the retainer clip 208 upward until the upper flange 210 is directly in contact with the socket latch 110.

In the test memory module step 2310, the memory module 108 secured in the memory socket 106 with the socket latches 110 and the retainer clip 208 can be tested while in a harsh environment. The retainer clip 208 can reduce the likelihood of environmental vibration dislodging the memory module 108 from the memory socket 106.

5.0. Example Embodiments

Examples of some embodiments are represented, without limitation, in the following clauses and use cases:

According to an embodiment, a method of operation of a memory module testing system comprising opening a memory socket to receive a memory module, the memory socket attached to a motherboard, and the memory socket having a module support tower, closing a socket latch at the module support tower, the socket latch configured to secure the memory module to the memory socket by inserting a socket latch tab into a memory module notch, and the socket latch having a latch head, and attaching a retainer clip to the module support tower of the memory socket for securing the socket latch in a closed position, the retainer clip having an upper flange directly on the latch head, the retainer clip having a lower flange directly on the motherboard, and the upper flange and the lower flange coupled together with a left clip arm and a right clip arm for forming a flag spring acting as a vibration dampener along a y-axis running from the memory socket to the motherboard for operating in a vibration environment.

In an embodiment, the method further comprises positioning an upper flange top of the upper flange directly on a bottom side of a latch head bottom side of the latch head of the socket latch, and positioning a lower flange bottom of the lower flange against a top side of the motherboard, the retainer clip under compression with a clip height less than a latch lock height.

In an embodiment, the method further comprises configuring the left clip arm and the right clip arm both having a clip gap facing the upper flange and the lower flange.

In an embodiment, the method further comprises configuring the left clip arm and the right clip arm for pressing outward against the inner surface of the module support tower.

In an embodiment, the method further comprises opening the left clip arm and the right clip arm to have a clip opening width greater than a width of the module support tower.

According to an embodiment, a method of operation of a memory module testing system comprising opening a memory socket to receive a memory module, the memory socket attached to a motherboard, and the memory socket having a module support tower at an end of the memory socket, closing a socket latch at the end of the memory socket, the socket latch configured to secure the memory module to the memory socket by inserting a socket latch tab into a memory module notch, and the socket latch having a latch head, and attaching a retainer clip to the module support tower of the memory socket for securing the socket latch in a closed position, the retainer clip having an upper flange directly on the latch head, the retainer clip having a lower flange directly on the motherboard, and the upper flange and the lower flange coupled together with a left clip arm and a right clip arm for forming a vertical spring acting as a vibration dampener along a y-axis running from the lower flange to the upper flange for operating in a vibration environment, the retainer clip configured with the left clip arm and the right clip arm both in direct contact with an inner side of the module support tower for constraining movement along an x-axis, the x-axis extending in parallel with a long axis of the memory socket, and the left clip arm and the right clip arm separated by a clip opening with the memory module positioned within the clip opening, the retainer clip configured with the left clip arm and the right clip arm in direct contact with portions of opposite sides of the module support tower for constraining movement along a z-axis perpendicular to the memory module, and testing the memory module to verify the memory module is electrically connected to the memory socket in a test vibration environment.

In an embodiment, the method further comprises detecting an improper electrical connection between memory module pins of the memory module and socket contacts of the memory socket.

In an embodiment, the method further comprises positioning a right clip arm tip of the right clip arm directly on an inner side of the module support tower.

In an embodiment, the method further comprises opening the left clip arm and the right clip arm to form a horizontal spring around the module support tower.

In an embodiment, the method further comprises rotating the retainer clip around a pivot point attached to the lower flange.

According to an embodiment, a memory module retainer clip comprises a retainer clip configured to attach to a module support tower of a memory socket of a motherboard, the retainer clip further configured for securing a memory module in the memory socket in a vibration environment by holding a socket latch in a closed position, the socket latch configured to secure the memory module to the memory socket by inserting a socket latch tab into a memory module notch, and the socket latch having a latch head, and wherein the retainer clip includes an upper flange directly on a latch head of the socket latch, the retainer clip includes a lower flange directly on the motherboard, and the upper flange and the lower flange are coupled together with a left clip arm and a right clip arm to form a flat spring acting as a vibration dampener along a y-axis running from the memory socket to the motherboard.

In an embodiment, the system further comprises the retainer clip includes an upper flange top of the upper flange positioned directly on a bottom side of a latch head bottom side of the latch head of the socket latch, and a lower flange bottom of the lower flange positioned against a top side of the motherboard, the retainer clip under compression with a clip height less than a latch lock height.

In an embodiment, the system further comprises the left clip arm and the right clip arm both having a clip gap facing the upper flange and the lower flange.

In an embodiment, the system further comprises the left clip arm and the right clip arm pressing outward against an inner surface of the module support tower.

In an embodiment, the system further comprises the left clip arm and the right clip arm configured to have a clip opening width smaller than a width of the module support tower.

In an embodiment, the system further comprises the retainer clip configured with the left clip arm and the right clip arm both in direct contact with an inner side of the module support tower for constraining movement along an x-axis, the x-axis extending in parallel with a long axis of the memory socket, and the left clip arm and the right clip arm separated by a clip opening with the memory module positioned within the clip opening, the retainer clip configured with the left clip arm and the right clip arm in direct contact with portions of opposite sides of the module support tower for constraining movement along a z-axis perpendicular to the memory module.

In an embodiment, the system further comprises the retainer clip securing the socket latch in place for forming an electrical connection between secure memory module pins of the memory module and socket contacts of the memory socket.

In an embodiment, the system further comprises a right clip arm tip of the right clip arm positioned directly on an inner side of the module support tower.

In an embodiment, the system further comprises the left clip arm and the right clip arm joined at the upper flange and the lower flange to form a horizontal spring around the module support tower.

In an embodiment, the system further comprises the lower flange of the retainer clip attached to a pivot point.

6.0. Extensions And Alternatives

As used herein, the terms "first," "second," "certain," and "particular" are used as naming conventions to distinguish queries, plans, representations, steps, objects, devices, or other items from each other, so that these items may be referenced after they have been introduced. Unless otherwise specified herein, the use of these terms does not imply an ordering, timing, or any other characteristic of the referenced items.

In the drawings, the various components are depicted as being communicatively coupled to various other components by arrows. These arrows illustrate only certain examples of information flows between the components. Neither the direction of the arrows nor the lack of arrow lines between certain components should be interpreted as indicating the existence or absence of communication between the certain components themselves. Indeed, each component may feature a suitable communication interface by which the component may become communicatively coupled to other components as needed to accomplish any of the functions described herein.

The term "directly on" means contact between at least portions of two or more elements with no intervening elements. The term "on" means contact between at least portions of two or more elements with one or more intervening elements.

In the specification, embodiments of the invention have been described with reference to numerous specific details that may vary from implementation to implementation. Thus, the sole and exclusive indicator of what is the invention and is intended by the applicants to be the invention, is the set of claims that issue from this application, in the specific form in which such claims issue, including any subsequent correction. In this regard, although specific claim dependencies are set out in the claims of this application, it is to be noted that the features of the dependent claims of this application may be combined as appropriate with the features of other dependent claims and with the features of the independent claims of this application, and not merely according to the specific dependencies recited in the set of claims. Moreover, although separate embodiments are discussed herein, any combination of embodiments and/or partial embodiments discussed herein may be combined to form further embodiments.

Any definitions expressly set forth herein for terms contained in such claims shall govern the meaning of such terms as used in the claims. Hence, no limitation, element, property, feature, advantage or attribute that is not expressly recited in a claim should limit the scope of such claim in any way. The specification and drawings are, accordingly, to be regarded in an illustrative rather than a restrictive sense.

It is understood that the system functionality can be described using terms like module, unit, system, subsystem, and component that represent devices that can be implemented using different combinations of hardware, firmware, and software elements. The devices can include electric subsystems, optical subsystems, mechanical subsystems, and other physical elements. These elements can include computing elements that can execute the firmware and software of the system.

What is claimed is:

1. A method of operation of a memory module testing system comprising:
    opening a memory socket to receive a memory module, the memory socket attached to a motherboard, and the memory socket having a module support tower;
    closing a socket latch at the module support tower, the socket latch configured to secure the memory module to the memory socket by inserting a socket latch tab into a memory module notch, and the socket latch having a latch head; and
    attaching a retainer clip to the module support tower of the memory socket for securing the socket latch in a closed position, the retainer clip having an upper flange with a portion of the upper flange directly on the latch head, the retainer clip having a lower flange with a portion of the lower flange directly on the motherboard, and the upper flange and the lower flange coupled together with a left clip arm and a right clip arm for forming a flag spring acting as a vibration dampener along a y-axis running from the memory socket to the motherboard for operating in a vibration environment, the left clip arm and the right clip arm both having a clip gap facing the upper flange and the lower flange.

2. The method as claimed in claim 1, wherein attaching the retainer clip includes:
    positioning an upper flange top of the upper flange directly on a bottom side of a latch head bottom side of the latch head of the socket latch; and
    positioning a lower flange bottom of the lower flange against a top side of the motherboard, the retainer clip under compression with a clip height less than a latch lock height.

3. The method as claimed in claim 1, wherein attaching the retainer clip includes configuring the left clip arm and the right clip arm for pressing against the inner surface of the module support tower.

4. The method as claimed in claim 1, wherein attaching the retainer clip includes opening the left clip arm and the right clip arm to have a clip opening width greater than a width of the module support tower.

5. The method as claimed in claim 1, wherein attaching the retainer clip includes rotating the retainer clip around a pivot point attached to the lower flange.

6. A method of operation of a memory module tester comprising:
- opening a memory socket to receive a memory module, the memory socket attached to a motherboard, and the memory socket having a module support tower at an end of the memory socket;
- closing a socket latch at the end of the memory socket, the socket latch configured to secure the memory module to the memory socket by inserting a socket latch tab into a memory module notch, and the socket latch having a latch head; and
- attaching a retainer clip to the module support tower of the memory socket for securing the socket latch in a closed position, the retainer clip having an upper flange with a portion of the upper flange directly on the latch head, the retainer clip having a lower flange with a portion of the lower flange directly on the motherboard, and the upper flange and the lower flange coupled together with a left clip arm and a right clip arm for forming a vertical spring acting as a vibration dampener along a y-axis running from the lower flange to the upper flange for operation in a vibration environment, the retainer clip configured with the left clip arm and the right clip arm both in direct contact with an inner side of the module support tower for constraining movement along an x-axis, the x-axis extending in parallel with a long axis of the memory socket, and the left clip arm and the right clip arm both having a clip gap facing the upper flange and the lower flange and separated by a clip opening with the memory module positioned within the clip opening; the retainer clip configured with the left clip arm and the right clip arm in direct contact with portions of opposite sides of the module support tower for constraining movement along a z-axis perpendicular to the memory module.

7. The method as claimed in claim 6, wherein testing the memory module includes detecting an improper electrical connection between memory module pins of the memory module and socket contacts of the memory socket.

8. The method as claimed in claim 6, further comprising positioning a right clip arm tip of the right clip arm directly on an inner side of the module support tower.

9. The method as claimed in claim 6, wherein attaching the retainer clip includes opening the left clip arm and the right clip arm to form a horizontal spring around the module support tower.

10. The method as claimed in claim 6, wherein attaching the retainer clip includes rotating the retainer clip around a pivot point attached to the lower flange.

11. A memory module retainer clip comprising:
- a retainer clip configured to attach to a module support tower of a memory socket of a motherboard, the retainer clip further configured for securing a memory module in the memory socket in a vibration environment by holding a socket latch in a closed position, the socket latch configured to secure the memory module to the memory socket by inserting a socket latch tab into a memory module notch, and the socket latch having a latch head; and wherein:
- the retainer clip includes an upper flange with a portion of the upper flange directly on the latch head of the socket latch,
- the retainer clip includes a lower flange with a portion of the lower flange directly on the motherboard, and
- the upper flange and the lower flange are coupled together with a left clip arm and a right clip arm to form a flat spring acting as a vibration dampener along a y-axis running from the memory socket to the motherboard, the left clip arm and the right clip arm both having a clip gap facing the upper flange and the lower flange.

12. The system as claimed in claim 11, wherein the retainer clip includes:
- an upper flange top of the upper flange positioned directly on a bottom side of a latch head bottom side of the latch head of the socket latch; and
- a lower flange bottom of the lower flange positioned against a top side of the motherboard, the retainer clip under compression with a clip height less than a latch lock height.

13. The system as claimed in claim 11, wherein the left clip arm and the right clip arm are pressing against an inner surface of the module support tower.

14. The system as claimed in claim 11, wherein the retainer clip includes the left clip arm and the right clip arm to have a clip opening width smaller than a width of the module support tower.

15. The system as claimed in claim 11, wherein:
- the retainer clip is configured with the left clip arm and the right clip arm both in direct contact with an inner side of the module support tower for constraining movement along an x-axis, the x-axis extending in parallel with a long axis of the memory socket; and
- the left clip arm and the right clip arm separated by a clip opening with the memory module positioned within the clip opening; the retainer clip configured with the left clip arm and the right clip arm in direct contact with portions of opposite sides of the module support tower for constraining movement along a z-axis perpendicular to the memory module.

16. The system as claimed in claim 15, wherein the retainer clip secures the socket latch in place for forming an electrical connection between secure memory module pins of the memory module and socket contacts of the memory socket.

17. The system as claimed in claim 15, further comprising a right clip arm tip of the right clip arm positioned directly on an inner side of the module support tower.

18. The system as claimed in claim 15, wherein the left clip arm and the right clip arm are joined at the upper flange and the lower flange to form a horizontal spring around the module support tower.

19. The system as claimed in claim 15, wherein the lower flange of the retainer clip is attached to a pivot point.

* * * * *